FEEDBACK TYPE ANALOG TO DIGITAL CONVERTER
Filed April 4, 1966
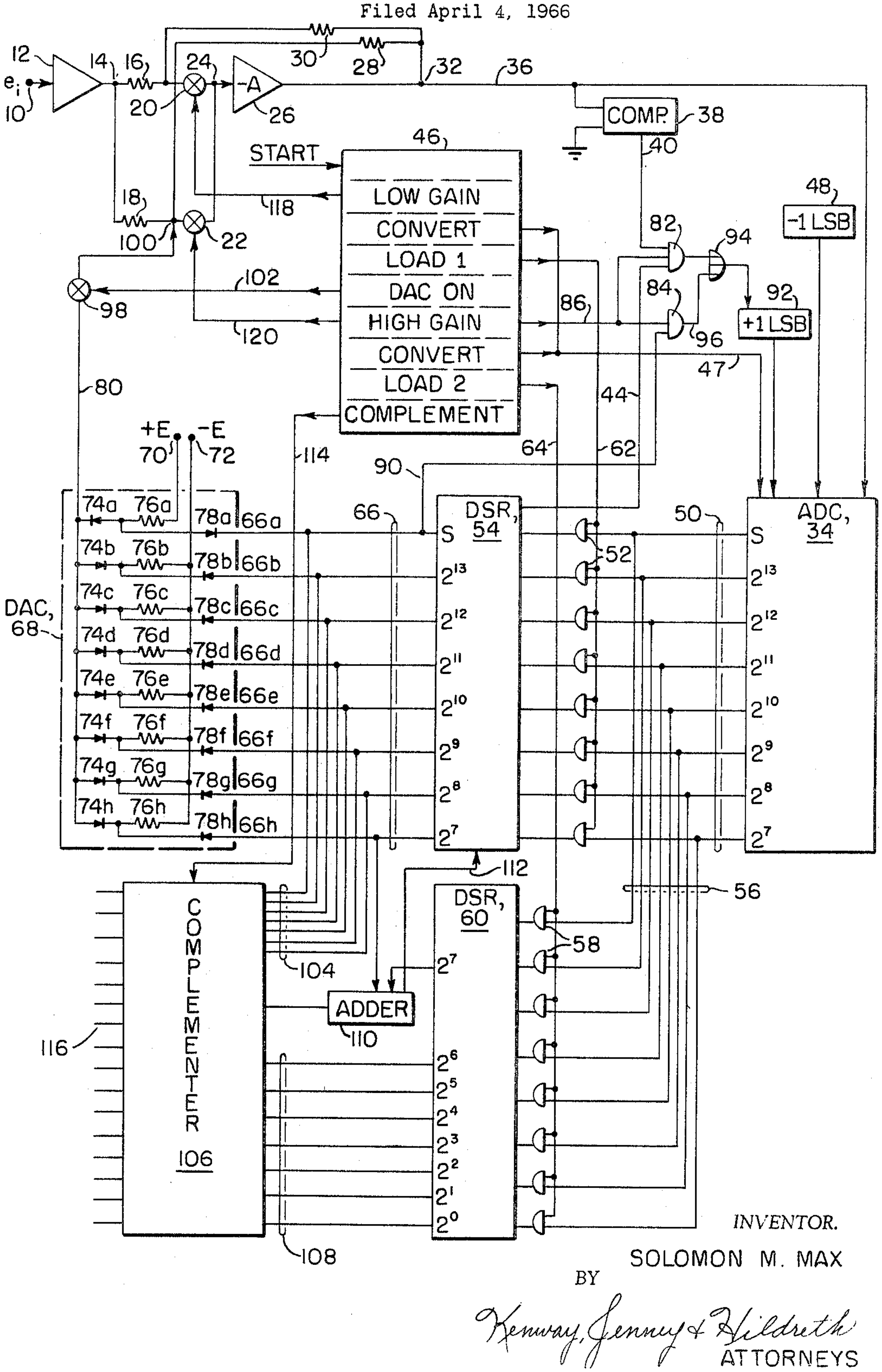
INVENTOR.
SOLOMON M. MAX
BY
Kenway, Jenney & Hildreth
ATTORNEYS 3,483,550

FEEDBACK TYPE ANALOG TO DIGITAL CONVERTER

Solomon Mannes Max, Brookline, Mass., assignor to Adage, Incorporated, Boston, Mass., a corporation of Massachusetts Filed Apr. 4, 1966, Ser. No. 539,688
Int. Cl. H04l 3/00; H03k 13/00
U.S. Cl. 340—347 17 Claims

ABSTRACT OF THE DISCLOSURE

An analog to digital converter operates in a feedback mode in which a series of digital output signals generated by successive operations of an internal analog to digital converter are reconverted to analog form and mixed with the original input signal. The several digital signals are also stored in respective registers and summed in overlapping relationship to provide an overall output signal having more digit positions than are produced by any one operation of the internal converter.

My invention relates to an analog to digital converter of the feedback type. In particular, it relates to a high speed analog to digital converter of the feedback type in which the digits of the digital output signal are formed in groups instead of being formed either sequentially or simultaneously.

Analog to digital converters are known devices and find frequent application in the fields of instrumentation and control, data transmission, telemetry, and various other fields where it may be desired to convert an analog input signal, which appears as a voltage or current, into a digital output signal which may be represented by the presence or absence of signals at discrete voltage levels. For applications of this type, it is desirable, and often essential, that the converters operate at high speed and with great accuracy.

In general, two basic types of electronic analog to digital converters have been developed, these being the simultaneous-type converter and the sequential-type converter. In the former, the digits of the digital output signal are determined simultaneously. In a typical converter of this type, the analog input signal is applied to a large number of comparators simultaneously, the comparators effectively forming a coding circuit which divides the analog input signal into a number of discrete levels, each of these levels being associated with a defined digital value. Such converters suffer the serious disadvantage that a large number of individual comparators are required to effectuate the conversion. For example, if it is desired to convert an analog input signal into a binary digital output signal in which the digits in each digit position may take on the value 0 or 1, it will be found that $2^n-1$ comparators are required, $n$ being the number of digit positions in the digital output signal. Thus, for a ten digit binary converter, $2^{10}-1=1023$ comparators are required and the cost of this type of converter becomes prohibitive. The number of comparators may be reduced somewhat by the use of suitable coding and decoding circuitry but this introduces greater complexity into the system as well as additional expense.

In a sequential type of converter, the individual digits in the digital output signal are determined one at a time. An example of a typical converter of this type is the feedback-type, digit-at-a-time converter in which the analog equivalent of the digit in each digital position of the output signal is subtracted from the input signal as each digit is determined until the difference between the analog input signal and the feedback signal is reduced to zero or to some small but acceptable value. In converters of this type, the digital output signal may be in decimal form (in which the digits in each digital position of the output signal may range from 0 to 9), in binary form (in which the digits range from 0 to 1) or in any other desired form. In general, converters of this type require $n$ comparisons to form the digital output number, where $n$ is the number of digital positions in the output number. An example of a converter of this type is shown in United States Patent No. 3,052,880, issued Sept. 4, 1962 to F. M. Young et al.

The amplifiers and comparators used in circuits of this type require a discrete time to settle down to their quiescent value after each digit position has been determined, and it will be found that the time required for a complete conversion is proportional to $n^2$. Accordingly, it will be seen that in situations in which the desire for greater resolution dictates a large number of digital output positions, the time required to convert an analog signal into digital form increases extremely rapidly as additional digit positions are desired.

I have found that an extremely rapid analog to digital converter which is capable of operating at far higher speeds than converters heretofore available may be constructed by forming the digital output signal in groups of digital positions before combining the digital "words" so formed into the final digital output. This technique avoids the speed limitations imposed by the digit-at-a-time feedback converter while obviating the large number of comparator circuits required by the simultaneous type converter.

Accordingly, it is an object of my invention to provide an improved analog to digital converter of the feedback type. Further, it is an object of my invention to provide an improved analog to digital converter of the feedback type in which the analog input signal is converted into successive groups of digital signals, each group representing a number of digit positions, the groups then being combined to form the desired digital output signal.

I have further found that errors which occur in the lower order bits of each of the groups so formed may readily be corrected before the groups are combined to form the desired output signal. Accordingly, it is a further object of my invention to provide an improved analog to digital converter of the feedback type in which conversion errors may be corrected during the conversion process. Yet another object of my invention is to provide an analog to digital converter of the feedback type which is capable of operating at extremely high speeds.

Other and further objects and features of my invention will appear below in the following detailed description of a preferred embodiment thereof which has been selected for purposes of illustration and which is shown in the accompanying drawings in which:

The single figure of the drawings illustrates, in block diagram form, a preferred embodiment of an analog to digital converter of the feedback type constructed in accordance with my invention.

In accordance with my invention, I provide an analog to digital converter of the feedback type for converting an analog input signal into a digital output signal containing a plurality of digit positions. The feedback converter comprises an analog to digital converter embedded in the feedback loop (an "internal" converter) and having a digit capacity which is less than the number of digit positions which are to appear in the feedback converter digital output signal. The output of the internal converter is connected to a plurality of digital storage registers by means of transfer gates or the like which are selectively actuated by a program controller to transfer the digital signals generated by the internal converter to each of the storage registers in a predetermined sequence. Connected to all but one of these digital storage registers is one or more digital to analog converters which provide analog output signals proportional to the digital count stored in the registers to which they are respectively connected. The analog signals so generated are fed back to a summing junction at which point they are combined in subtractive phase with the analog input signal to form an error signal. Typically, the summing junction is formed from a high gain operational amplifier having a plurality of impedances associated with the amplifier in order that the gain of the amplifier circuit may be selectively varied. The error signal appearing at the summing junction is then amplified and the output of the amplifier circuit is applied to the internal analog to digital converter to complete the feedback loop.

In effect, the analog input signal to be converted is fed through the amplifier circuit to the internal analog to digital converter where a first digital conversion is made and the results stored in a first digital storage register to form the first or highest-order group of digit positions of the digital output signal. An analog signal proportional to the count stored in this register is then generated by a first digital-to-analog converter, and subtracted from the analog input signal at the summing junction. The gain of the amplifier circuit is then changed and the amplified error signal is applied to the internal converter to generate a new digital signal which is stored in a second storage register. The process is then continued, the gain of the amplifier circuit being changed each time a new conversion is to be made until the final conversion is stored in the last digital storage register. Since the conversion has now been completed within the limit of accuracy of the feedback converter, the count in the last digital storage register is not converted to analog form for feeding back to the summing junction.

Due to noise or other inaccuracies present in the internal converter, errors may appear in the least significant bit of each conversion performed by the internal converter. Since, when the digital "words" are combined to form the complete digital output signal, the digit positions of the earlier conversions will be weighted more heavily than those of the later conversions, the errors in the earlier conversions must be corrected before the digital "words" are combined. This may be achieved by overlapping one or more of the lower and higher bits of the successive conversions as will be seen in more detail hereinafter.

CONSTRUCTION

Referring now to the drawing, I have shown an analog to digital converter of the feedback type constructed in accordance with my invention. For purposes of illustration, I have shown a two-stage binary converter, that is, a converter which converts an analog input signal into a binary digital output signal in two stages. The converter illustrated is also bipolar, that is, it will accept both positive and negative input signals; for negative input signals, the output will be in two's complement form. From the description which follows, it will become more readily apparent that my invention is not limited to this specific type of converter and that the conversion may be performed in any number of stages and may use any desired type of output form such as binary, decimal, octal, etc.

As shown in the single figure of the drawings, an analog input signal $e_i$ is applied to an input terminal 10 of a buffer amplifier 12. The amplifier 12 may be a high input impedance, low output impedance amplifier having unity gain and is used to isolate the feedback converter from the input signal source. If the input signal source is a low impedance source with respect to the feedback converter, the converter will not cause substantial loading of the source and the buffer amplifier 12 may be omitted. The output of the amplifier 12 is applied to a terminal 14 and thence through resistors 16 and 18 and switches 20 and 22 to an input terminal 24 of an amplifier 26 which is a high gain direct current inverting amplifier having feedback resistors 28 and 30 connected around it to provide a variable gain. The switch 20 is closed via a signal from a programmer 46 via a lead 118; this connects the resistors 16 and 30 into the amplifier circuit to provide a gain of −1. Similarly, the switch 22 is closed via a signal from the programmer 46 on a lead 120; this connects the resistors 18 and 28 into the amplifier circuit to provide a gain of −128. The programmer unit 46 controls the timing and sequencing of the various steps involved in performing a complete conversion of the analog input signal to digital form and preferably comprises a stepping register which automatically sequences through its various states to control the conversion. The sequencing is initiated on application of a "Start" pulse which first clears the programmer and then sets it to its first or "Low Gain" state. Stepping registers are well-known devices in the computer art and accordingly the register 46 need not be described in further detail. The output signal of the amplifier 26 appears at a terminal 32 and is supplied to an analog to digital converter 34 via a lead 36. For purposes of illustration, the internal converter 34 is shown as an 8-bit binary converter of the bipolar type having 8 digit positions in its output, these digit positions being shown as having weighted values ranging from $2^7$ through $2^{13}$ and a sign digit. For positive input signals to the converter 34 the output of this converter will be in straight binary form, the sign digit being set to "1" to indicate a positive input; for negative inputs to the converter 34, the output of this converter will be in two's complement form, the sign digit being set to "0" to indicate a negative input. Although any of several converters may be used for the converter 34, a preferred type of converter is shown in patent application Serial No. 420,538 now U.S. Pat. No. 3,384,889, filed Dec. 23, 1964 by Paul G. Lucas and which is assigned to the assignee of the present invention. The converter illustrated therein is a bipolar binary converter in which negative inputs are represented in one's or two's complement form.

In addition to the input signal on the lead 36, the converter 34 also receives additional input signals from the least significant bit sources 48 and 92. These sources, which may consist of a precision resistor in series with an appropriate voltage source, supply to the summing junction of the converter 34 an amount of current equal to one least significant bit of this converter. This current is combined with that due to the input signal to form a modified input signal for purposes which will be described below. The source 48 is always connected to the converter 34 while the source 92 is connected thereto only on receipt of appropriate signals from AND gates 82 or 84 via an OR gate 94. The gate 82 will supply a signal to the gate 94 on the simultaneous receipt of signals from a comparator 38 via a lead 40, from the programmer 46 via a lead 86, and from a digital storage register 54 via a lead 44. The comparator 38 will supply an output signal on the lead 40 whenever the analog signal appearing on the lead 36 is positive with respect to ground or other reference potential. The programmer 46 will supply a signal on the lead 86 whenever the programmer has stepped to the "High Gain" state. The signal from the digital storage register 54 will be supplied to the gate 82 when the digit positions $2^7$ through $2^{13}$ contain digital 1's; in such a situation, a carry which would change the sign of the sign bit is imminent. In similar fashion the gate 84 receives input signals from the programmer 46 via the lead 86 when the programmer is in the "High Gain" state and from the digital storage register 54 via a lead 90 when the sign digit position contains a digital 1. The addition of ±1 LSB to the input of the converter 34 is required for error correction purposes when operating in the one's complement notation as will appear more fully hereinafter. The register 54 preferably comprises a plurality of flip-flops, each of which may be switched between the "0" state and the "1" state, the former state being conveniently represented by a voltage level that is negative with respect to ground or other reference potential and the latter being represented by a voltage level that is positive with respect to the reference potential. The register 54 must be capable of propagating a carry though each of its digit positions on receipt of an appropriate carry signal. In addition to supplying output signals on leads 66 in the form of digital 1's or 0's, the register 54 supplies an output signal on the lead 44 whenever a carry to the sign bit is imminent.

The digital output signal of the converter 34 is generated on receipt of a command from the programmer 46 via a lead 47 when the programmer is in the "Convert" state and is supplied via leads 50 to transfer gates 52, here shown as AND gates, and thence to a storage register 54; the signal on each lead 50 from the converter 34 will be either a digital 0 or a digital 1. The output of the converter 34 is also applied to transfer gates 58, also shown as AND gates, via leads 56 and thence to a digital storage register 60 which is similar in construction to the register 54 but which need not be able to propagate a carry. The gates 52 and 58 also receive input signals from the programmer unit 46 via leads 62 and 64 respectively.

The contents of the storage register 54 are applied via leads 66 to a digital-to-analog converter 68. The converter 68 comprises a source of positive and negative voltages which are applied to terminals 72 and 70 respectively and which supply current to a plurality of diodes 74 in series with resistors 76 and having a plurality of diodes 78 connected to the junction of the diodes 74 and the resistors 76 respectively. The converter 68 is a two's complement converter and will supply positive output currents for positive input signals in straight binary form and will supply negative output currents for negative input signals in two's complement form.

The output of the converter 68 is applied via a lead 80 to a switch 98 and thence to a junction 100 of the resistor 18 and the switch 22. The switch 98 is closed by an appropriate signal from the programmer unit 46 via a lead 102. The operation of this converter is as follows: If a digital 0 (negative voltage level) is applied to the converter 68 via the lead **66*a*, the diode 78*a* will be turned "on" and current will flow from the positive reference level, through the resistor 76*a*, and thence through the diode 78*a*; except for the small voltage drop across this diode, the junction of the resistor 76*a* and the diode 74*a* will thus be at a negative voltage level. Since the lead 80 will be at zero volts or ground potential when it is connected to the summing junction 24, the diode 74*a* will be reverse biased and no current will flow through this diode to the output lead 80. If a digital 1 (positive voltage level) is applied via the lead 66*a*, the diode 78*a* will be blocked and +16,384 units of current will flow from the source +E through the resistor 76*a* and the diode 74*a* to the output lead 80. In effect, a digital 1 on the lead 66*a* will turn on the diode 74*a* to supply current to the lead 80 and a digital 0 will block this diode. Since the diodes 78*b*–78*h* and the diodes 74*b*–74*h* are poled in the reverse direction to that of the diodes 78*a* and 74*a* respectively, a digital 1 will block these diodes and a digital 0 will turn them on. The resistors 76*a*–76*h* are chosen to supply currents of appropriate magnitude to the lead 80 via the diodes 74*a*–74*h*. Thus, +16,384 units of current will be supplied through the resistor 76*a*, −8,192 units of current will be supplied through the resistor 76*b*, −4,096 units of current through the resistor 76*c*, etc., the magnitude of the currents through the remaining resistors being related in binary fashion. The magnitude of the current through the resistor 76*h*, −128 units of current, will be referred to as one least significant bit of the converter 68**.

The output from the storage register 54 is also supplied via leads 104 to a complementer 106; similarly, the output from the storage register 60 is applied via leads 108 to the complementer 106. The unit 106, which may consist simply of a plurality of flip-flops or similar two-state devices, provides a digital output signal on leads 116 which is the complement of the digital signals supplied as inputs on the leads 104 and 108. The least significant bit from the storage register 54 and the most significant bit or sign bit from the storage register 60 are applied at an adder unit 110 where these bits are added before being applied as an input to the complementer 106. The adder unit 94 may generate a carry and such carry is applied via a lead 112 to the digital storage register 54 which is itself capable of propagating a carry when necessary. The digital output signal is formed by the complementer 106 when the programmer steps to its last or "Complement" state in which a signal is applied to the complementer 106 via a lead 114 from the programmer. It will be noted that if the register 54 is formed from a plurality of flip-flops, each of the flip-flops having two output leads, the signal on one output lead will be the complement of the signal on the other output lead; thus, a first output lead from each flip-flop will supply the desired output signal and a second output lead from each flip-flop will supply the complement of this signal. In such a case, the output of the feedback converter may be taken directly from these second output leads and the complementer 106 may be omitted entirely.

OPERATION

The operation of the feedback converter will now be described in detail with reference to a specific numerical example. For purposes of illustration, the following conventions will be adopted:

(1) for an analog input signal of +1 mv. at the input terminal 10, the digital output signal at the terminals 108 should be 100000000000001; for an analog input signal of −1 mv., the digital output at the terminals 108 should be 011111111111110 (one's complement form).

(2) A one mv. signal at the input terminal 10 will cause a current equal to 1 mv./=$i$ amps to flow into or out of the summing junction $\mathbf{24}^R$ depending on the sign of the input signal, where R is the resistance in ohms of the resistances 16, 18 or 30; the magnitude of R is chosen to form current units of convenient size. For example, if $R=1K$, $$i=\frac{10^{-3}}{10^3}=10^{-6} \text{ amps.}$$

All currents in the feedback converter, the internal converter, and the digital to analog converter 64 will be referred to in terms of the current unit $i$. One least significant bit (LSB) of the feedback converter has a value of one current unit $i$ which is equivalent to a value of 1 mv. One least significant bit (LSB) of the converter 34 and the converter 68 has a value of 128 $i$ current units which is equal to 128 mv.

(3) For an input signal to the converter 34 which lies between two successive digital values of the converter, the output of the converter may be either of these two values. For example, for an input signal to the converter whose magnitude is greater than 10000001 but less than 10000010 (as referred to the converter 34), the converter 34 may supply either of these values as an output signal. This uncertainty as to which digital value will be supplied by the converter 34 will be referred to as an error in the least significant bit of this converter.

A numerical example will now be used to illustrate the conversion in detail. Assume that the input signal to the thermal 10 is +261 mv. This signal will be applied to the terminal 14 unchanged in either magnitude or phase since the amplifier 12 is merely a unity gain, high input impedance, low output impedance amplifier which serves to isolate the signal source from the feedback converter. A Start pulse is now applied to the programmer unit 46 to cause this unit to switch to its "Low Gain" state in which the switch 20 is closed via a signal applied by the programmer 46 on the lead 118. With the switch 20 closed, the signal appearing at the terminal 14 is connected to the summing junction 24 via the resistor 16, and the resistor 30 is connected around the amplifier from the terminal 32 to the summing junction 24 to provide a gain of −1. The input signal at the terminal 14 supplies 261 mv./$R$=261 $i$ current units to the summing junction 24; since the amplifier circuit now has a gain of −1, an analog signal of $$\frac{261 \text{ mv.}}{R}\cdot(-R)=-261 \text{ mv.}$$

will appear at the terminal 32 and will be applied to the analog to digital converter 34 via the lead 36; this will cause a current of −261 $i$ current units to flow into the summing junction of the converter 34. The least significant bit source 48 will also supply −128 $i$ current units to the summing junction of the converter 34; thus the total input to the converter will be −261 $i$−128 $i$= −389 $i$ current units. Since the signal on the lead 36 is negative, no output signal will appear on the lead 40 from the comparator 38 and the gate 82 will remain closed as will the gate 84 at this time. When the programmer 46 steps to its next or "Convert" state, a signal is applied via the lead 47 to the converter 34 to initiate an analog to digital conversion. One least significant bit of the converter 34 has a value of 128 $i$ current units=128 mv.; accordingly, the converter 34 will interpret the analog signal on the lead 36 as being −389$i$/128$i$ which is between −3 LSB and −4 LSB (as referred to the converter 34) and will thus supply an output signal on the leads 50 which may be either 01111101 or 01111100 (two's complement form).

(1) Assume that the converter 34 supplies as an output the first of these signals, namely, 01111101. The digital signals on the lead 50 will be passed through the transfer gates 52 on receipt of a signal on the lead 62 when the programmer is stepped to the "Load 1" state and will be stored in the digital storage register 54. The programmer is then stepped to its next two states in which the switch 98 is first closed via a signal on the lead 102 and the switch 22 is closed via a signal from the programmer on the lead 120; closing switches 22 and 98 connects the output lead 80 of the digital to analog converter 68 to the summing junction 24 and switches the resistors 18 and 28 into the amplifier circuit so that this circuit now has a gain of −128. A signal is also applied via the lead 86 to the gates 82 and 84 when the programmer is in the "High Gain" state to condition these gates for the passage of signals applied to their input terminals.

With the DAC 68 connected to the summing junction 24 and with the digital signal 01111101 applied to the DAC from the storage register 54, the DAC generates an output current of −256 $i$ current units; the negative sign indicates that this current is subtracted from the summing junction 24. The net current into the summing junction is then given by the sum of the current due to the analog input signal and the current due to the feedback signal on the lead 76, or +261$i$−256$i$=5 $i$ units into the junction 24. Since the amplifier circuit now has a gain of −128, the output signal at the terminal 32 will be −5·128 mv.; since this signal is negative, the comparator 38 will again fail to supply an output signal on the lead 40 and the gate 82 will not open. Similarly, since the sign bit of the number in the register 54 is 0, the gate 84 will not open.

The input signal on the lead 36 will be added to the signal from the source 48 to give a net input signal to the converter 34 of −5·128$i$−128$i$=6·128$i$. This signal will be viewed by the converter 34 as being equal to −6·128$i$/128$i$=−6 least significant bits (referred to the converter 34) and this converter will supply on its output leads 50 a digital signal given by 011111010 when the programmer steps to its "Convert" state. This signal will be transferred to the storage register 60 when the transfer gates 58 are conditioned by the signal on the lead 64 from the programmer 46. The digital numbers now appearing in the storage registers 54 and 60 will be applied as inputs to the complementer 106, the least significant bit in the register 54 and the most significant bit (sign bit) in the register 60 being first applied to the adder unit 110. Since these bits are 1 and a 0 respectively, the adder unit will supply a 1 bit to the complementer 106 and no carry will be generated. When the converter is stepped to its last or "Complement" state, the digital signals appearing on the leads 104 and 108, as well as the digital signal supplied as an output from the adder unit 110, will be fed into the complementer 106 by means of the signal appearing on the lead 114 from the programmer 46 and the output will now be available on the leads 116.

The overlapping of the digital numbers stored in the registers 54 and 60 may be viewed as follows:

$$\begin{array}{l} 01111101 \\ \qquad\quad 01111010 \\ \hline 011111011111010 \end{array}=\text{N}$$

100000100000101=complement of N which is the desired answer.

(2) Instead of supplying a digital signal equal to 01111101 as the output of the first conversion, the converter 34 may supply the alternate output signal 01111100. In this case, when this signal is applied to the digital to analog converter 64, the converter will supply an output signal of −128$i$−256$i$=−384$i$. When added to the summing junction together with the current due to the analog input signal, the current at the summing junction will be 261$i$−384$i$=−123$i$; a negative sign indicates that the current is drawn from the summing junction. Since the amplifier is operating with a gain of −128 during the second conversion, this current will generate an output signal at the terminal 32 of +123$i$·128$R$=+123·128 mv. The input signal to the comparator 38 now being positive, the comparator will generate a signal on the lead 40 which will condition the gate 82; similarly, the gates 82 and 84 will be conditioned for conduction by the signal appearing on the lead 86 from the programmer 46. Since, however, the $2^7$ through $2^{13}$ digit positions of the register 54 do not all contain digital 1's, no signal will appear on the lead 44 and the gate 82 will not conduct. Similarly, no signal will appear on the lead 90 since the sign bit of the number in the register 54 is a digital 0 and the gate 84 will not conduct. The total input to the converter 34 will thus be given by +123·128 mv.−1·128 mv.=+122·128 mv. and the converter will supply the digital equivalent of this signal on its output leads 50, namely, 11111010. The signal will be applied to the storage register 60 through the transfer gates 58 when the converter steps to its "Load 2" state. Again, the output signals from the storage registers 54 and 60 will be applied to the complementer 106, the least significant bit of the register 54 and the most significant or sign bit of the register 60 being first applied to the adder unit 110. Since the latter bits are 0 and 1 respectively, the adder will supply an output of 1 bit to the complementer 106 and no carry will be generated.

The above overlapping and complementing may be summarized as follows:

$$\begin{array}{l} 01111100 \\ \qquad\quad 11111010 \\ \hline 011111011111010 \end{array}=\text{N}$$

100000100000101=complement of N which again is the desired answer.

It will be noted that, regardless of which digital output the converter 34 supplies during the first conversion, the output signal of the feedback converter appearing on the leads 116 will be the same. This is because the converter 34, during the second conversion, will supply an output signal that will compensate for any excess of deficiency in the first conversion. It will also be noted that an off-set of 1 least significant bit (referred to the converter 34) has been supplied to the converter 34 during the first and second conversions. The reasons for this will become more apparent in connection with the following table which shows several numbers in the vicinity of 0, their digital equivalent, and the current that will be supplied by the digital to analog converter 68 in response to each of these digital signals (negative numbers are shown in two's complement form).

TABLE I

| Analog input to input terminal 10 (in mv.) | Analog input to converter 34 (in LSB's referred to converter 34) | Digital output of converter 34 | DAC current |
|---|---|---|---|
| −256 | +2 | 10000010 | +384i |
| −128 | +1 | 10000001 | +256i |
| 0 | 0 | 10000000 | +128i |
| +128 | −1 | 01111111 | 0 |
| +256 | −2 | 01111110 | −128i |

As may be seen from Table 1, an analog input of +256 mv. will generate a digital equal to 01111110 which will cause the digital to analog converter 68 to supply a current of $-128i$ to the summing junction 24. This current, when added to the current due to the analog input signal, will produce a net current into the summing junction of $+256i-128i=+128i$ which, when multiplied by the gain of the amplifier during the second conversion, will cause the converter 34 to overload. Thus, the analog input signal applied to the converter during the first conversion must be decreased by 128 $i$ currents units =128 mv. to insure that the converter is not overloaded; this is accomplished by means of the LSB source 48. In effect, if a number lies between $n$ and $(n-1)$ LSB's, we change its range to $(n-1)$ to $n$ LSB's; for negative numbers, $-n$ and $-(n+1)$ LSB's, the corresponding range is shifted to $-(n+1)$ to $-(n+2)$.

This range shift must be effectuated during the first conversion for both positive and negative input signals to the feedback converter. In addition to insuring that the digital number resulting during the first conversion will generate an analog feedback signal of appropriate magnitude to add to the input signal, this range shift also insures that the results of the second conversion will always be *added* to the results of the first conversion. When the sign of the first conversion is positive (digital 1), this addition is straight forward and no extra LSB (referred to the converter 34) need be subtracted during the second conversion. When the sign of the first conversion is negative (digital 0), however, one LSB (referred to the converter 34) must be subtracted during the second conversion also due to the peculiarities of addition in the negative domain. We have seen this above in connection with the conversion of +261 mv.

Let us now suppose that an analog input signal of −261 mv. is applied to the input terminal 10 of the feedback converter. This signal will be reproduced with the same phase and magnitude at the terminal 14 and supplied through the resistor 16 to the summing junction 24 when the programmer unit steps to its "Low Gain" state. Since the amplifier circuit initially has a gain of −1, this signal appears as a positive signal of +261 mv. at the terminal 32 and is applied to the converter 34 via the lead 36. This signal is also applied to the comparator 38 and, since its magnitude is greater than 0, an output signal appears on the lead 40 which is applied to the gate 82. Since the programmer 46 is in the "Low Gain" state, however, no signal will appear on the lead 86 and the gates 82 and 84 will remain closed. The total input to the converter 34 is then given by +261 mv.−128 mv.= +133 mv. Since one least significant bit of the converter 34 equals 128 mv., the converter will view the input signal at its input terminals as being between +1 LSB and +2 LSB and accordingly will supply a digital output in the former case of 10000001 and in the latter case of 10000010. The following events will then occur:

(1) Assume that converter supplies an output of 10000001. After this number is transferred to the storage register 54 and applied to the digital to analog converter 68, the converter 68 will generate an output current on the lead 80 of $+256i$. This current will be supplied to the summing junction 24 during the second conversion after the switch 22 has been closed and it will be added to the input signal to give a net current at the summing junction of $-261i+256i=-5i$. This current will generate an output voltage at the terminal 32 of $+5\cdot128$ mv., since the amplifier is in its high gain state. A positive signal on the lead 36 will cause the comparator 38 to generate an output signal on the lead 40 to condition the gate 82 for conduction; this gate will remain closed, however, since the $2^7-2^{13}$ digit positions of the register 54 do not contain all 1's. The gate 84 will be open however, due to the concurrence of the signals on the lead 86 when the programmer is in the "High Gain" state and on the lead 90 when the sign digit of the register 54 is positive. The gate 84 drives the LSB source 92 via the gate 94 to supply +1 LSB to the input of the converter 34. Since the source 48 also supplies −1 LSB to the converter, these additional or "error-correcting" signals cancel and the total input to the converter 34 is equal to $+5\cdot128$ mv. The converter 34 will then supply on its output leads 50 a digital signal corresponding to +5 least significant bits and this digital signal is given by 100000101. This signal is applied to the storage register 60 after passing through the transfer gates 58 and is then applied to the complementer 106 together with the output from the storage register 54, the least significant bit of the register 54 and the most significant bit of the register 60 being applied to the adder unit 110 before being transferred to the complementer. This may be summarized as follows:

$$\frac{\begin{array}{r}10000001\phantom{0000000}\\ 10000101\end{array}}{100000100000101}=N$$

011111011111010=complement of N.

This is the desired answer and it will be noted that this is just the one's complement of +261 mv. as it should be.

(2) If, during the first conversion, the converter 34 supplies the digital output signal 10000010 on the output leads 50, the digital to analog converter 68 will supply an output current on the lead 80 of $+128i+256i=384i$, and the total current into the summing junction when the feedback current is added to the current due to the analog input signal, will be $-261i+384i=+123i$. This current will generate an output at the terminal 32 of $-123\cdot128$ mv. Since this signal is negative, no output signal will be supplied on the lead 40 and the gate 82 will thus be prevented from passing any input signals thereto. The gate 84, however, will be conditioned for input signals applied to its input terminals since the sign of the first conversion is positive and the programmer is in the "High Gain" state. The contributions of the sources 48 and 92 again cancel and the total input to the converter 34 is equal to $-123\cdot128$ mv. The converter 34 will, in response to this input signal, supply an output signal on the leads 50 given by 00000101. This signal again is supplied to the storage register 60 and thence to the complementer 106.

The result of this conversion is as follows:

$$\frac{\begin{array}{r}10000010\phantom{0000000}\\ 00000101\end{array}}{100000100000101}=N$$

011111011111010=one's complement of N which again is the correct result.

CONCLUSION

Various modifications will suggest themselves to those skilled in the art in view of the above disclosure and it is intended that such modifications shall be covered herein. For example, as previously mentioned, the complementer unit 106 may be omitted entirely if appropriate storage registers 54 and 60 are chosen. Further, the digital output signal of the feedback converter may be formed in three, four, or more stages instead of two stages as shown and described herein. It has been found, however, that with components presently available, a two stage conversion is close to the optimum insofar as minimizing conversion time is concerned. It will also be apparent that the internal converter 34 may operate in one's complement notation for negtaive signals or any other desired notation. For one's complement operation, 1 LSB must be subtracted from the converter 34 during the first conversion if the input signal to the converter is positive at this time. In addition, during the second conversion, a correction of 1 LSB of the same sign as the first conversion must be supplied to the converter whenever the first and second conversions are of opposite sign. These corrections are due to the peculiarities of the number system used. It will also be apparent that the converter 34 need not be bipolar; in such a case, the adder unit 110 will be replaced by an appropriate adder-subtracter unit to effectuate the desired combination of the individual conversions to form the total digital output signal. It will also be apparent that more than one bit of each of the individual conversions may be combined or overlapped to provide error correction and that this can be accomplished within the framework of the circuitry shown in FIG. 1.

From the above it will be seen that I have provided an improved analog to digital converter of the feedback type. Further, it will be seen that I have provided an improved analog to digital converter of the feedback type in which the analog input signal is converted into successive groups of digital signals, each group representing a number of digital positions, the groups then being combined to form the desired digital input signal. Further, I have provided an improved analog to digital converter of high speed and extended resolution in which each of the conversions of the internal converter is corrected for errors which may occur in the least significant bits before the results of these conversions are added to form the desired digital output signal.

It will thus be seen that the objects set forth above, among those made apparent from the preceding description, are efficiently attained and, since certain changes may be made in the above constructions without departing from the scope of the invention, it is intended that all matter contained in the above description and shown in the accompanying drawings shall be interpreted as illustrative and not in a limiting sense.

It is also to be understood that the following claims are intended to cover all the generic and specific features of the invention herein described and all statements of the scope of the invention which, as a matter of language, might be said to fall therebetween.

What is claimed is:

1. An analog to digital converter of the feedback type for converting an analog input signal into a digital output signal containing a plurality of digit positions comprising in combination, an amplifier having means associated therewith for selectively changing the gain of said amplifier, means connecting said analog input signal as one input to said amplifier, an internal analog to digital converter connected to the output of said amplifier for converting the amplifier output signal to digital form, said converter supplying as simultaneous outputs during each conversion a plurality of digits representing different digital positions, the number of said digits being greater than one but less than the number of digital positions in said feedback converter digital output signal, a plurality of storage registers for storing said digital signal, each said register having means for storing a plurality of digits representing different digit positions, means for selectively loading said storage registers from said internal converter in predetermined sequence, a digital to analog converter connected to said storage registers for generating an analog output signal proportional to the count stored in all but one of said registers, means connecting the analog output signal from said digital to analog converter as another input to said amplifier; and means for summing in overlapping relationship the digital signals stored in said registers thereby to provide a converter digital output signal containing a number of digital positions which number is larger than the number of digits stored in any one of said registers and smaller than the sum of the numbers of digits stored in all of said registers.

2. The combination defined in claim 1 in which said means for selectively loading said storage registers from said internal converter includes a plurality of transfer gates interposed between said converter and said storage registers and means for selectively actuating said transfer gates whereby said storage registers may be loaded from said converter in predetermined sequence.

3. The combination defined in claim 2 in which at least all but one of said storage registers include means for propagating a carry from the lower-order digit position to the higher order digit position of each said register.

4. The combination defined in claim 3 in which said transfer gates comprise a plurality of AND gates having an output terminal and a pair of input terminals, the output terminal of each said gates being connected to supply input signals to said storage registers, a first input terminal of each of said gates being connected to receive an output signal from said internal converter and a second input terminal of each of said gates being connected to receive an actuating signal whereby the signals on each said first input terminal may be transferred to said registers.

5. The combination defined in claim 4 in which the means associated with said amplifier for changing the gain thereof includes a plurality of electrical impedances which are selectively switched into said amplifier circuit before each successive conversion by said internal converter.

6. The combination defined in claim 5 in which said internal converter is a bipolar binary converter which supplies digital outputs in straight binary form for positive input signals applied thereto and which supplies digital outputs in two's complement form for negative inputs applied thereto.

7. The combination defined in claim 6 in which said internal converter includes means associated therewith for supplying error correction signals to said converter.

8. The combination defined in claim 7 in which a first of said error correction signals is applied to said converter during said first conversion independent of the sign of the signal applied to said converter during said first conversion and a second of said signals is applied to said converter during said second conversion dependent on the sign of said first conversion.

9. The combination defined in claim 8 in which the number of said storage registers equals two.

10. An analog to digital converter of the feedback type for converting an analog input signal into a digital output signal containing a plurality of digit positions comprising in combination, an amplifier having means associated therewith for selectively changing the gain of said amplifier, means connecting said analog input signal as a first input to said amplifier, an internal analog to digital converter connected to the output of said amplifier for converting the amplifier output signal to digital form, first and second storage registers for storing the digital output signal from said internal analog to digital converter, each said register having means for storing a plurality of digit positions, said first storage register including means for propagating a carry from the lowest-order bit to the higher-order bit, means for selectively loading said storage registers from said analog to digital converter in predetermined sequence, a digital to analog converter connected to said first storage register for generating an analog output signal proportional to the count stored in said register, and means connecting the analog output signal from said digital to analog converter as a second input to said amplifier.

11. The combination defined in claim 10 in which said internal analog to digital converter provides a digital signal having a number of digit positions equal to at least half the number of digit positions which are to appear in said feedback converter digital output signal.

12. The combination defined in claim 11 in which said means for selectively loading said storage registers from said analog digital converter includes a plurality of transfer gates interposed between said analog to digital converter and said storage registers, and means for selectively actuating said transfer gates whereby said storage registers may be loaded from said analog to digital converter in predetermined sequence.

13. The combination defined in claim 12 in which the means associated with said amplifier for changing the gain thereof includes a plurality of electrical impedances which are selectively switched into said amplifier circuit before each successive conversion by said analog to digital converter.

14. The combination defined in claim 12 in which the lowest-order bit from said first conversion and the highest-order bit from said second conversion are added together before being supplied as output signals of the feedback converter, any carry generated by such addition being supplied to the lowest order bit of said first converter.

15. The combination defined in claim 11 in which said analog to digital converter is a feedback converter of the bipolar type.

16. The combination defined in claim 15 in which said converter includes error correction means including means supplying a first correction signal during a first conversion and means for supplying a second signal during a second conversion, said second signal being dependent on the sign of said first conversion.

17. An analog to digital converter of the feedback type for converting an analog input signal into a digital output signal containing a plurality of digit positions comprising in combination, an amplifier having a plurality of impedances associated therewith, means for selectively switching said impedances into said amplifier circuit to change the gain of said amplifier at discrete times, means connecting said analog input signal to said amplifier as a first input thereto, an analog to digital converter connected to said amplifier for converting the amplifier output signal to digital form, said converter providing as an output a digital signal having a number of simultaneous digit positions greater than one but less than the number of digit positions of said feedback converter, first and second digital storage registers, means connecting said registers to said internal converter at discrete times, a digital to analog converter connected to said first register for transforming the number stored therein to analog form, means connecting said analog signal to said amplifier as a second input thereto, and means for adding the contents of said first and second storage registers to form said feedback converter digital output signal having a number of digital positions which number is larger than the number of digits provided by said converter.

References Cited

UNITED STATES PATENTS

| | | | |
|---|---|---|---|
| 3,070,786 | 12/1962 | MacIntyre | 340—347 |
| 3,072,332 | 1/1963 | Margopoulos | 340—347 |
| 3,105,231 | 9/1963 | Gordon et al. | 340—347 |
| 3,146,343 | 8/1964 | Young | 340—347 |
| 3,177,482 | 4/1965 | Chase | 340—347 |
| 3,311,910 | 3/1967 | Doyle | 340—347 |
| 3,384,889 | 5/1968 | Lucas | 340—347 |

MAYNARD R. WILBUR, Primary Examiner

MICHAEL K. WOLENSKY, Assistant Examiner